United States Patent
Bachhuber et al.

(10) Patent No.: US 7,593,831 B2
(45) Date of Patent: Sep. 22, 2009

(54) METHOD AND APPARATUS FOR TESTING DELAY LINES

(75) Inventors: Werner Bachhuber, München (DE); Osman Doertok, München (DE); Parag Parikh, Allentown, PA (US)

(73) Assignee: Agere Systems Inc., Allentown, PA (US)

( * ) Notice: Subject to any disclaimer, the term of this patent is extended or adjusted under 35 U.S.C. 154(b) by 57 days.

(21) Appl. No.: 11/499,363

(22) Filed: Aug. 4, 2006

(65) Prior Publication Data
US 2008/0033678 A1 Feb. 7, 2008

(51) Int. Cl.
*G04F 8/00* (2006.01)
*H03H 11/26* (2006.01)
(52) U.S. Cl. ...................... 702/176; 327/261
(58) Field of Classification Search .............. 702/79, 702/176, 117, 125, 126; 327/151, 156, 160, 327/158; 331/17
See application file for complete search history.

(56) References Cited

U.S. PATENT DOCUMENTS

| | | | | |
|---|---|---|---|---|
| 6,493,653 | B1* | 12/2002 | Drinkard et al. .......... | 702/176 |
| 6,544,807 | B1* | 4/2003 | Bach .......................... | 438/18 |
| 7,157,948 | B2* | 1/2007 | McClannahan et al. ..... | 327/151 |
| 2002/0103618 | A1* | 8/2002 | Schleifer et al. ........... | 702/176 |
| 2005/0265505 | A1* | 12/2005 | Nelson et al. .............. | 375/376 |
| 2006/0071698 | A1* | 4/2006 | Parikh ........................ | 327/231 |
| 2007/0008044 | A1* | 1/2007 | Shimamoto .................. | 331/57 |

OTHER PUBLICATIONS

T.M. Mak, et al., "Testing Gbps Interfaces without a Gigahertz Tester", IEEE Design and Test of Computers, pp. 278-286, 2004.

* cited by examiner

*Primary Examiner*—Bryan Bui
(74) *Attorney, Agent, or Firm*—Mendelsohn, Drucker & Associates, PC; David L. Cargille; Steve Mendelsohn

(57) ABSTRACT

Disclosed is a circuit for testing a delay module. An output of a ring oscillator formed with the delay module is transmitted to a counter. The counter generates a plurality of counts, each count associated with a setting of control lines of the delay module. One of the plurality of counts is then compared with a previous one of the plurality of counts.

16 Claims, 3 Drawing Sheets

METHOD AND APPARATUS FOR TESTING DELAY LINES

BACKGROUND OF THE INVENTION

The present invention relates generally to delay lines and more specifically to testing delay lines.

Delay lines are used in many applications in high speed circuitry. One such application is high speed memory interfaces. Specifically, delay lines are typically used in high speed memory (e.g., double data rate (DDR)) interfaces to adjust the timing of source-synchronous data and strobe signals with picosecond accuracy. Step sizes of delay lines (e.g., 90 nanometer delay lines) are typically 10-20 picoseconds and each delay line conventionally has, e.g., 128 delay steps.

There are delays associated with a processor communicating with a high speed (e.g., DDR) memory. For example, there are delays associated with communicating over a circuit board, delays associated with buffers and circuit board components, etc. As a result, there is an unpredictable delay between an external memory and the processor communicating with the external memory.

For synchronous communications between the processor and the external memory, a clock signal associated with the data communicated from the memory to the processor is shared between the two devices. As these communications occur at extremely high speeds, such as 400 or 800 Mbps, the placement of the edge of the clock signal becomes very important for sampling the data signal. Whatever data change is made (e.g., from a low value to a high value and then from the high value to the low value (or in the opposite direction)), the sampling clock signal (i.e., strobe) has to be centered about the data change to sample the bit correctly. One or more delay lines are used to adjust the delay of the data signal or the strobe in such a way that the clock signal is delayed by a quarter of the period (i.e., 90 degrees).

There are several types of delay lines, such as a slave delay, a minimum delay, and a master delay. A master delay receives a reference clock which has twice the frequency of the strobe and typically uses this reference clock to control one or more slave delay lines. The slave delay line has, e.g., 128 delay steps controlled by the master delay line. In 90 nm or smaller technology nodes, each step typically represents delay as low as 10-20 ps.

The master delay maintains its control over the slave delay during conditions of process, voltage, and temperature (PVT) associated with the processor. In particular, the master delay keeps the delay through the slave delay constant for all PVT.

In order to balance out the minimum attainable delay by the slave delay, a minimum delay cell can be used in other paths.

One problem with these delay lines is testing the delay lines. In particular, the time interval between the steps of a slave delay is typically 10-20 picoseconds and there are many steps. In a design, there may be hundreds of slave and minimum delay lines. Typical testing systems likely cannot accurately test the delay steps in a slave delay having such a miniscule time delay between steps and obtaining access to every delay line through the pins is not practical. Further, the delay associated with each delay step of a slave delay may be impacted by the process defects.

This delay error may lead to serious prior system problems in which the delay value needs to be controlled. A wrong delay step may inhibit the tuning of the system. To find the optimum sampling position in the presence of noise and jitter, delay lines have to be correct. When incorporated into a system, it often becomes extremely difficult to debug the problem as a faulty delay line.

Therefore, there remains a need to accurately test whether these delay lines are working properly.

BRIEF SUMMARY OF THE INVENTION

In accordance with an aspect of the present invention, a circuit for testing delay lines (i.e., a delay module) is constructed in which the delay lines form a ring oscillator whose frequency depends on the delay setting. This changes the often difficult picosecond measurement into a frequency count. By incrementing the delay steps of a delay line, a counter, register, and comparator configuration determines the monotonic behavior. By recording the count value for every step, absolute delay measurements can be performed.

In more detail and in one embodiment, a delay module has control lines to control the delay of the delay module. A ring oscillator is formed from the delay module and an inverter chain. The ring oscillator oscillates at a frequency dependent upon the setting of the control lines. A counter connected to the delay module is configured to generate a plurality of counts in response to settings of the control lines. A comparator is coupled to the counter and configured to compare one of the plurality of counts with a previous one of the plurality of counts. This comparison enables the determination of whether the delay module is operating correctly.

The delay module can be a slave delay, a master delay, and/or a minimum delay. Master, slave, and minimum delay lines can be tested in the same manner. The delay module can include more than one delay module.

The method allows on-chip testing of delay lines in complex, integrated circuits with little hardware overhead and with control access through a standardized JTAG test interface.

These and other advantages of the invention will be apparent to those of ordinary skill in the art by reference to the following detailed description and the accompanying drawings.

DETAILED DESCRIPTION

Figure 1:
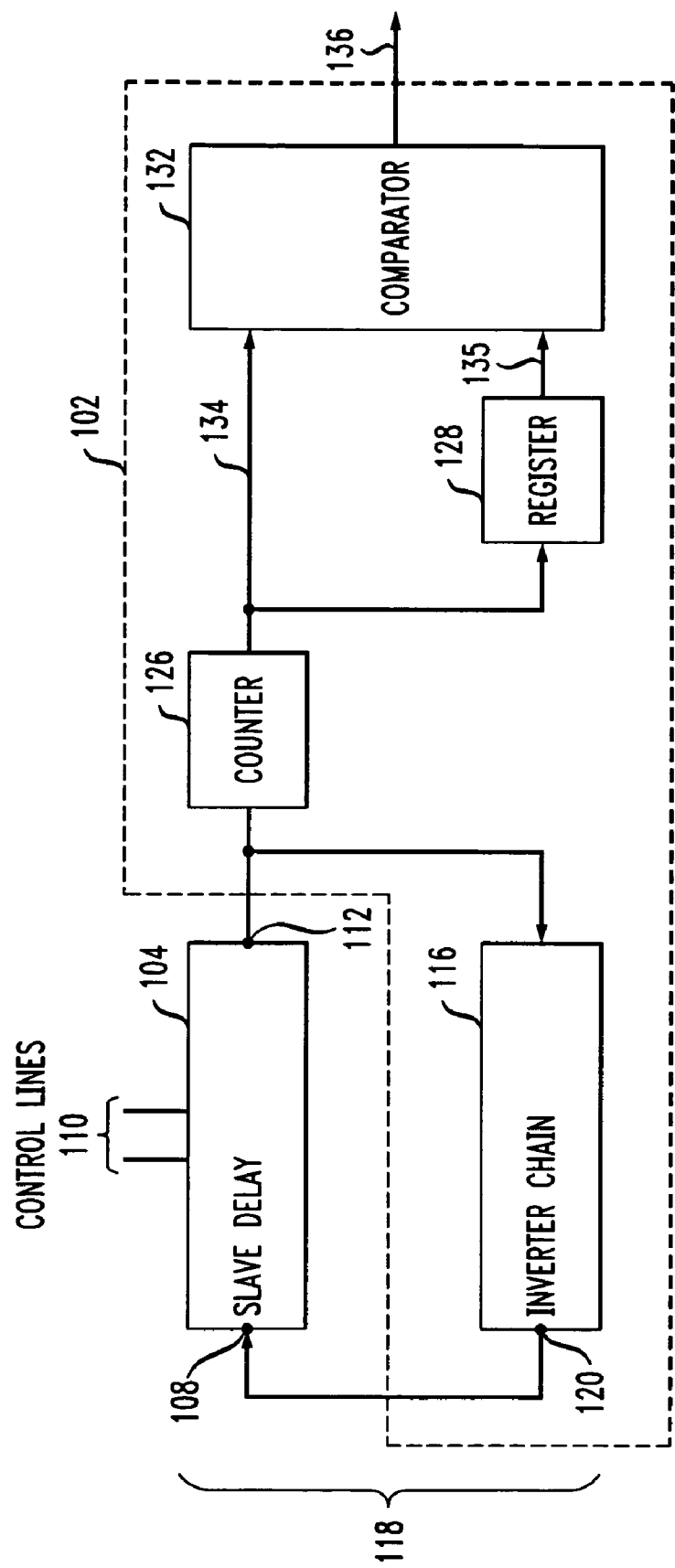
FIG. 1 is a block diagram of a circuit to test delay lines in accordance with an embodiment of the present invention.

FIG. 1 discloses a delay module tester 102. The delay module tester 102 is a circuit to test one or more delay lines, such as slave delay 104. The slave delay 104 has control lines 110 to control the delay. The input 108 of the slave delay 104 oscillates between "on" and "off" (i.e., between a "1" and a "0") because its output 112 is provided as feedback into an inverter chain 116. The output 120 of the inverter chain 116 is provided as input back into the slave delay 104. The slave delay 104 and the inverter chain 116 together form a ring oscillator 118.

The ring oscillator 118 therefore causes the slave delay 104 to oscillate at a frequency determined by the total delay of the loop consisting of the slave delay 104 and the delay of the inverter chain 116. The frequency of the oscillation is the inverse of the delay (i.e., period) of the loop. The total delay includes the delay associated with the slave delay 104 as well as the delay introduced by the components of the inverter chain 116. Thus, the slave delay 104 oscillates not at an absolute frequency but at a relative frequency (relative to the external delay introduced by the inverter chain 116, e.g., the delay introduced by its components). Thus, when the control lines 110 are incremented, the slave delay 104 introduces a different delay (and therefore a different frequency). As more delay is injected into the loop via the control lines 110, the frequency of the loop decreases.

The change in the delay results in a frequency change. The frequency is therefore a variable that changes as one or more process, voltage, or temperature changes. For example, if the control lines 110 are first set to 00 so that the delay is set to its minimum, then the slave delay 104 operates at a first frequency. If the control lines 110 are then set to the following delay step (i.e., 01), then the slave delay 104 operates at a second frequency that will be lower than (or equal to) the first frequency if the slave delay is operating correctly.

The output 112 of the slave delay 104 is used by a counter 126 to generate a count. The count is stored in a register 128 and provided to a comparator 132. Specifically, the comparator 132 receives as input output (i.e., count) 134 of the slave delay 104 and the previous output (i.e., previous count) 135 of the slave delay 104, as stored in the register 128. The comparator 132 compares the two slave delay outputs 134, 135 and determines whether the frequency of the current slave delay output is the same as, greater than, or less than the frequency of the previous slave delay output. The comparator 132 then provides an output 136 indicating the result of the comparison and, therefore, whether the slave delay 104 is operating correctly.

Figure 2:
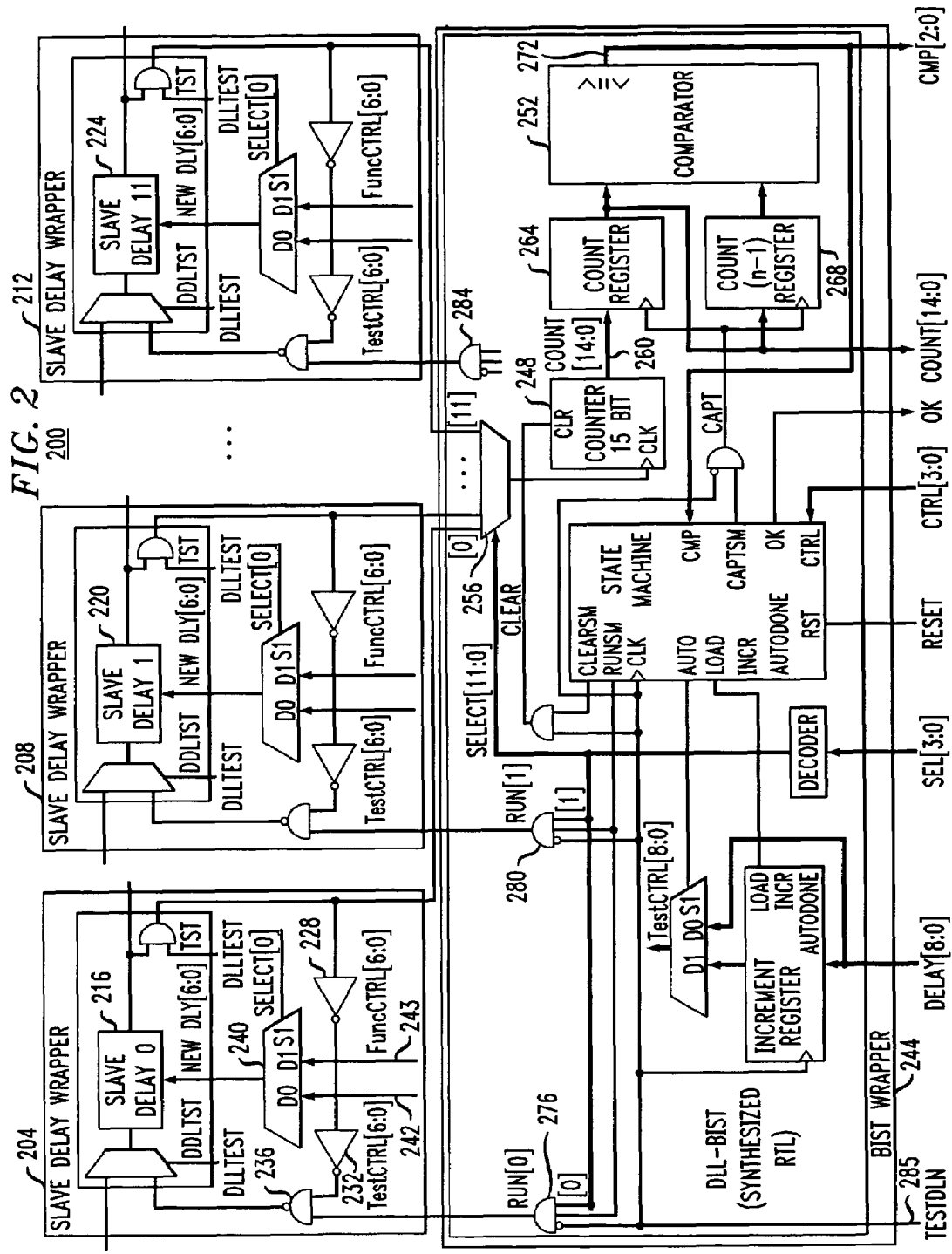
FIG. 2 is a more detailed block diagram of a circuit to test delay lines in accordance with an embodiment of the present invention.

FIG. 2 shows a more detailed block diagram of a circuit 200 used to test delay lines. The circuit 200 includes a chain of slave delay wrappers 204, 208, 212 having respective slave delays 216, 220, 224. Each slave delay wrapper 204, 208, 212 also includes a ring oscillator.

With respect to the first slave delay wrapper 204, its ring oscillator includes two inverters 228, 232 connected to a NAND gate 236. The odd number of inverters (i.e., three) result in a periodic output signal. This period arises from the fact that the signal has to pass through the inverters twice to get back to its original value because of the odd number of inversions in the feedback loop. The output of the ring oscillator oscillates and is input into a multiplexor coupled to the slave delay 216. The output of the slave delay 216 is provided as input into the first inverter 228.

The slave delay 216 also includes a control multiplexor 240 having as inputs the control lines 242, 243 for the slave delay 216. The control lines 242, 243 can be divided into a functional control line 243 and a test control line 242. The functional control line 243 provides the delay control in functional mode of operation while the test control line 242 is used to control the delay during the delay line testing. Although the slave delay 216 is shown with two control lines 242, 243, the slave delay 216 can be implemented with any number of control lines.

To test each slave delay, the delay of each slave delay is incremented (or decremented) by one. In particular, each slave delay 204, 208, 212 is connected to a testing circuit 244. The testing circuit 244 includes a counter 248 and a comparator 252. The output of each slave delay 216, 220, 224 is provided to a multiplexor 256 of the testing circuit 244 and then to the counter 248. The counter 248 counts up to a certain value based on its clock signal, which is the output of the multiplexor 256. In one embodiment, the counter 248 is a 15 bit counter. The output 260 of the counter 248 is provided to a first count register 264 and then to the comparator 252.

Thus, the first count register 264 stores the current output of the counter 248. The output 260 of the count register 264 is provided to a second count register 268 to store the previous counter output 260. Thus, the first count register 264 stores the current counter output 260 while the second count register 268 stores the previous counter output 260. The current and previous counter outputs 260 are provided as input into the comparator 252. The comparator 252 compares these two values and provides its comparison result as output 272.

The testing circuit 244 also includes a respective start/stop control gate 276, 280, 284 for each slave delay wrapper 204, 208, 212. The following description is for the first slave delay 216 but applies to any of the slave delays. The start/stop control gate 276 controls the starting and stopping of the slave delay 216 because the output of the start/stop control gate 276 is transmitted to the NAND gate 236 of the ring oscillator. If the output of the start/stop control gate 276 is set to "0", then the NAND gate 236 will output a "1" regardless of the output of the inverter 232. Thus, the start/stop control gate 276 controls whether any signal is input into the slave delay 216 via the NAND gate 236.

A signal 285 is provided as input into the start/stop control gate 276. In one embodiment, the signal 285 is a periodic signal (e.g., on for 10 milliseconds and off for 10 milliseconds). During the 10 milliseconds that the signal 285 is "on", the slave delay is configured (via the control multiplexor 240) to step through each of its delays. During this time, the counter 248 counts. The counter 248 stops counting when the signal 285 is switched "off". The counter 248 outputs its count to the comparator 252. For each step of the 128 delay steps, the comparator 252 compares the current count value with the previous count value to determine whether the current frequency is less than, greater than, or equal to the previous frequency.

To test minimum delay cells, the slave delays 216, 220, 224 are substituted for minimum delay cells and the same steps are performed. Each slave delay 216, 220, 224 may also be substituted for a master delay (with its own internal slave delay) to test the master delay using the same technique.

A master delay may also be tested in another manner. In particular, the output of a master delay can be connected to the functional control line 243 of the control multiplexor 240. As described above, the master delay keeps the delay of the slave delay constant for all PVT. The master delay then controls the frequency of oscillation of the slave delay. A reference clock is provided to the master delay in order for the master delay to control the slave delay.

The process, voltage, or temperature values can then be changed and the master delay can be tested with different PVTs. A master delay is operating correctly when the comparator 252 outputs values that do not change with different PVTs.

Figure 3:
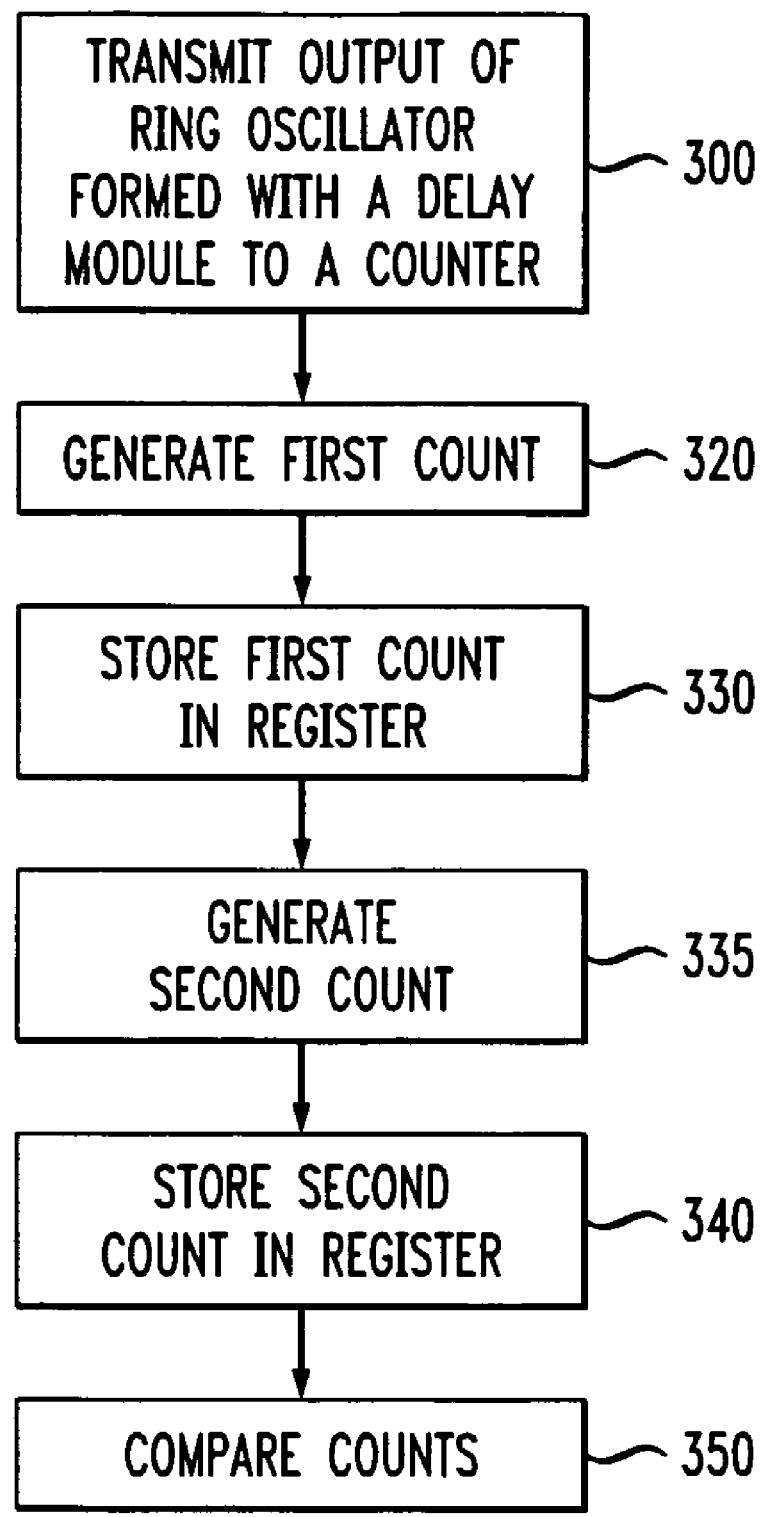
FIG. 3 is a flowchart of the steps performed by a circuit to test delay lines in accordance with an embodiment of the present invention.

FIG. 3 shows the steps performed by a circuit used to test delay lines. The output of a ring oscillator formed with a delay module is transmitted to a counter in step 300. The ring oscillator oscillates at a predetermined frequency associated with the setting of control lines of the delay module. During the oscillation, a counter generates a first count in step 320. The first count is stored in a register in step 330 and a second count is generated in step 335. This second count is stored in a different register in step 340 so that different registers store the first count and the second count. A comparator then compares the counts to determine whether the delay line is functioning properly in step 350.

The foregoing Detailed Description is to be understood as being in every respect illustrative and exemplary, but not restrictive, and the scope of the invention disclosed herein is not to be determined from the Detailed Description, but rather from the claims as interpreted according to the full breadth permitted by the patent laws. It is to be understood that the embodiments shown and described herein are only illustrative of the principles of the present invention and that various modifications may be implemented by those skilled in the art without departing from the scope and spirit of the invention. Those skilled in the art could implement various other feature combinations without departing from the scope and spirit of the invention.

The invention claimed is:

1. A circuit for testing a delay module having an input, an output, and control lines to control delay of said delay module, said circuit comprising:
    an inverter chain having an output that is coupled to said input of the delay module to form a ring oscillator that oscillates at a frequency dependent upon setting of said control lines;
    a counter having an input that is coupled to said output of said delay module and configured to generate a plurality of counts in response to settings of said control lines;
    a first register having an input that is coupled to an output of said counter and configured to store a first count of said plurality of counts; and
    a comparator having an input that is coupled to an output of said counter and an input that is coupled to an output of said first register, and configured to compare a second count of said plurality of counts output from said counter with said first count stored in the register to determine whether said delay module is operating correctly.

2. The circuit of claim 1 wherein said inverter chain has an output that is coupled to said input of one of a slave delay, a master delay, and a minimum delay.

3. The circuit of claim 1 wherein said inverter chain has an output that is coupled to said input of one of a plurality of delay modules.

4. The circuit of claim 1 wherein said inverter chain further comprises an odd number of inverters.

5. The circuit of claim 4 wherein said inverter chain further comprises a NAND gate having an input coupled to a start/stop control gate and having an output coupled to said input of said delay module.

6. The circuit of claim 1 further comprising a second register configured to store said second count of said plurality of counts.

7. The circuit of claim 1 further comprising a start/stop control gate configured to control said oscillating of said ring oscillator.

8. The circuit of claim 1 further comprising a master delay configured to be tested using said ring oscillator, wherein said delay module is a slave delay.

9. A method for testing a delay module comprising:
    transmitting output of a ring oscillator formed with said delay module to a counter;
    generating, by said counter, a plurality of counts, each count associated with a setting of control lines of said delay module;
    storing a first count of said plurality of counts in a first register; and
    comparing a second count of said plurality of counts with said first count stored in said first register to determine whether said delay module is operating correctly.

10. The method of claim 9 further comprising storing said second count of said plurality of counts in a second register.

11. The method of claim 9 further comprising controlling oscillating of said ring oscillator.

12. The method of claim 9 further comprising testing a master delay using said ring oscillator, wherein said delay module of said ring oscillator is a slave delay.

13. An apparatus for testing a delay module comprising:
    means for transmitting output of a ring oscillator formed with said delay module to a counter;
    means for generating a plurality of counts, each count corresponding to a setting of control lines of said delay module;
    means for storing first count of said plurality of counts and
    means for comparing a second count of said plurality of counts with said first count stored in said means for storing to determine whether said delay module is operating correctly.

14. The apparatus of claim 13 further comprising means for storing said second count of said plurality of counts.

15. The apparatus of claim 13 further comprising means for controlling oscillating of said ring oscillator.

16. The apparatus of claim 13 further comprising means for testing a master delay using said ring oscillator, wherein said delay module of said ring oscillator is a slave delay.

* * * * *